(12) United States Patent
Shoji

(10) Patent No.: US 7,573,057 B2
(45) Date of Patent: Aug. 11, 2009

(54) RADIATION IMAGE INFORMATION DETECTING METHOD AND APPARATUS

(75) Inventor: Takashi Shoji, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/411,124

(22) Filed: Apr. 26, 2006

(65) Prior Publication Data
US 2006/0237671 A1  Oct. 26, 2006

(30) Foreign Application Priority Data
Apr. 26, 2005  (JP) ............................. 2005-127845

(51) Int. Cl.
*A61B 6/00* (2006.01)

(52) U.S. Cl. ..................................... 250/591
(58) Field of Classification Search ................. 250/591
See application file for complete search history.

(56) References Cited

U.S. PATENT DOCUMENTS

| 6,268,614 | B1 | 7/2001 | Imai |
| 6,828,539 | B1 | 12/2004 | Kuwabara |
| 7,075,061 | B2 * | 7/2006 | Spahn ..................... 250/252.1 |
| 2005/0173642 | A1 * | 8/2005 | Petrick et al. .......... 250/370.09 |

FOREIGN PATENT DOCUMENTS

| JP | 10-208016 A | 8/1998 |
| JP | 2003-47605 A | 2/2003 |

* cited by examiner

Primary Examiner—Constantine Hannaher
(74) Attorney, Agent, or Firm—Sughrue Mion, PLLC

(57) ABSTRACT

High frequency offset component information is previously acquired from a solid-state radiation detector. Low frequency offset component information is acquired from the solid-state radiation detector before an operation for recording image information on the solid-state radiation detector is performed. The image signal, which has been outputted from the solid-state radiation detector having been subjected to the operation for recording the image information, is corrected in accordance with offset information, which is constituted of the high frequency offset component information and the low frequency offset component information. The image signal is thus capable of being corrected quickly and accurately such that offset components are removed from the image signal.

6 Claims, 5 Drawing Sheets

FIG.1

FIG.4A
IMAGING REQUEST SIGNAL

FIG.4B
LIGHT SOURCE OPERATION MODE

FIG.4C
LIGHT SOURCE ACTUATION

FIG.4D
HIGH-VOLTAGE ELECTRIC POWER SOURCE

FIG.4E
DETECTOR READY SIGNAL

FIG.4F
X-RAY IRRADIATION

FIG.4G
SIGNAL DETECTION PROCESSING

FIG.4H
OFFSET DATA ALTERING PROCESSING

FIG.5A
IMAGING REQUEST SIGNAL

FIG.5B
TFT OPERATION MODE

FIG.5C
TFT ACTUATION

FIG.5D
HIGH-VOLTAGE ELECTRIC POWER SOURCE

FIG.5E
DETECTOR READY SIGNAL

FIG.5F
X-RAY IRRADIATION

FIG.5G
SIGNAL DETECTION PROCESSING

RADIATION IMAGE INFORMATION DETECTING METHOD AND APPARATUS

BACKGROUND OF THE INVENTION

1. Field of the Invention

This invention relates to a radiation image information detecting method and apparatus, wherein radiation image information is detected from a solid-state radiation detector, which is capable of recording image information with respect to each of pixels when radiation carrying the image information is irradiated to the solid-state radiation detector, and which is capable of outputting an image signal representing the image information having been recorded.

2. Description of the Related Art

With respect to X-ray (radiation) imaging operations for medical diagnoses, and the like, various X-ray imaging apparatuses, in which solid-state radiation detectors (utilizing semiconductors as principal sections) are utilized as X-ray image information recording means, have heretofore been proposed and used in practice. With each of the X-ray imaging apparatuses described above, X-rays carrying image information of an object is detected by the solid-state radiation detector, and an image signal representing an X-ray image of the object is thereby obtained.

As for the solid-state radiation detectors to be utilized in the X-ray imaging apparatuses, various types of solid-state radiation detectors have heretofore been proposed. For example, from the view point of an electric charge forming process for converting the X-rays into electric charges, the solid-state radiation detectors may be classified into a photo conversion type of solid-state radiation detector and a direct conversion type of solid-state radiation detector. With the photo conversion type of the solid-state radiation detector, fluorescence, which has been produced by a fluorescent substance when X-rays have been irradiated to the fluorescent substance, is detected by a photo-conductor layer, and signal electric charges having thus been generated in the photo-conductor layer are accumulated at a charge accumulating section. Also, the signal electric charges having thus been accumulated at the charge accumulating section are converted into an image signal (an electric signal), and the thus obtained image signal is outputted from the solid-state radiation detector. With the direct conversion type of the solid-state radiation detector, signal electric charges, which have been generated in a photo-conductor layer when the X-rays have been irradiated to the photo-conductor layer, are collected with a charge collecting electrode and accumulated at a charge accumulating section, the signal electric charges having thus been accumulated at the charge accumulating section are converted into an electric signal, and the thus obtained electric signal is outputted from the solid-state radiation detector. In the direct conversion type of the solid-state radiation detector, the photo-conductor layer and the charge collecting electrode constitute a principal section.

Also, from the viewpoint of an electric charge read-out process for reading out the accumulated electric charges to the exterior, the solid-state radiation detectors may be classified into an optical read-out type of solid-state radiation detector and a thin-film transistor (TFT) read-out type of solid-state radiation detector. With the optical read-out type of the solid-state radiation detector, reading light (a reading electromagnetic wave) is irradiated to the solid-state radiation detector, and electric charges having been accumulated are thereby read out. With the TFT read-out type of the solid-state radiation detector, TFT's connected to a charge accumulating section are actuated successively, and electric charges having been accumulated are thereby read out. (The TFT read-out type of the solid-state radiation detector is described in, for example, U.S. Pat. No. 6,828,539.)

The applicant proposed an improved direct conversion type of solid-state radiation detector in, for example, U.S. Pat. No. 6,268,614. The improved direct conversion type of the solid-state radiation detector is a direct conversion type and optical read-out type of a solid-state radiation detector. The improved direct conversion type of the solid-state radiation detector comprises a recording photo-conductor layer, which is capable of exhibiting photo-conductivity when recording light (the X-rays, the fluorescence produced through irradiation of the X-rays, or the like) is irradiated to the recording photo-conductor layer. The improved direct conversion type of the solid-state radiation detector also comprises a charge transporting layer, which acts approximately as an electrical insulator with respect to electric charges having a polarity identical with the polarity of latent image charges, and which acts approximately as an electrical conductor with respect to transported electric charges having a polarity opposite to the polarity of the latent image charges. The improved direct conversion type of the solid-state radiation detector further comprises a reading photo-conductor layer, which is capable of exhibiting the photo-conductivity when a reading electromagnetic wave is irradiated to the reading photo-conductor layer. The recording photo-conductor layer, the charge transporting layer, and the reading photo-conductor layer are overlaid in this order. The signal electric charges (i.e., the latent image charges) carrying image information are accumulated at an interface (i.e., a charge accumulating section) between the recording photo-conductor layer and the charge transporting layer. Also, electrodes (i.e., a first electrical conductor layer and a second electrical conductor layer) are formed on opposite sides of the combination of the three layers described above. In the improved direct conversion type of the solid-state radiation detector, the recording photo-conductor layer, the charge transporting layer, and the reading photo-conductor layer constitute a principal section.

Ordinarily, in an image signal having been acquired from each of the solid-state radiation detectors described above, an offset component has been superposed with respect to each of pixels of the solid-state radiation detector. In such cases, the problems occur in that accurate image information is not capable of being acquired. In order for the problems described above to be eliminated, it may be considered to employ a technique, wherein offset component information is acquired just before an imaging operation is performed, and wherein the image signal having been acquired with the imaging operation is corrected in accordance with the offset component information such that the offset components are removed from the image signal. However, in order for the offset component information to be acquired from all of the pixels of the solid-state radiation detector, a long time is required. Therefore, in such cases, the problems occur in that it becomes necessary for the imaging operator to wait for a long time before the imaging operation becomes possible. The problems described above are not appropriate from the view point of work flow.

Also, a method and an apparatus, wherein the offset component information with respect to the solid-state radiation detector is acquired just before the imaging operation is performed and just after the imaging operation has been performed, and wherein the image signal having been acquired with the imaging operation is corrected in accordance with the offset component information such that the offset components are removed from the image signal, have been disclosed in, for example, Japanese Unexamined Patent Publication No. 10(1998)-208016. However, it often occurs that, just after the image signal has been read out from the solid-state radiation detector, residual signal charges (i.e., residual latent image charges) remain in the solid-state radiation detector. Therefore, with the disclosed method and the disclosed apparatus, the offset components are not always capable of being acquired accurately. Further, there is a strong demand for the capability of the viewing of an acquired visible image immediately after the imaging operation has been performed. However, with the disclosed method and the disclosed apparatus, wherein it is necessary for the offset component information to be acquired just after the imaging operation has been performed, a long time is required before the viewing of the acquired visible image becomes possible, and therefore it is not possible to satisfy the aforesaid demand for the capability of the viewing of the acquired visible image immediately after the imaging operation has been performed.

An apparatus aiming at satisfying the demand for the capability of the viewing of the acquired visible image immediately after the imaging operation has been performed has been proposed in, for example, Japanese Unexamined Patent Publication No. 2003-047605. With the proposed apparatus, two independent correction tables are prepared for amplifying devices, whose offset characteristics are apt to alter with the passage of time, and for the solid-state radiation detector, whose offset characteristics are not apt to alter with the passage of time. Also, with respect to the solid-state radiation detector, which requires a long time for the acquisition of the offset component information, the offset component information is acquired previously. Further, with respect to only the amplifying devices, whose offset component information is capable of being acquired quickly, the offset component information is acquired just before the imaging operation is performed. In this manner, the acquired image signal is corrected. However, the solid-state radiation detector involves a certain degree of the alteration of the offset characteristics with the passage of time. Therefore, with the proposed apparatus, the correction of the image signal is not capable of being made accurately.

SUMMARY OF THE INVENTION

The primary object of the present invention is to provide a radiation image information detecting method, wherein radiation image information is detected from a solid-state radiation detector, which is capable of recording image information with respect to each of pixels when radiation carrying the image information is irradiated to the solid-state radiation detector, and which is capable of outputting an image signal representing the image information having been recorded, and wherein an acquired image signal is capable of being corrected quickly and accurately such that offset components are removed from the image signal.

Another object of the present invention is to provide an apparatus for carrying out the radiation image information detecting method.

The present invention provides a radiation image information detecting method, wherein an image signal is acquired from a solid-state radiation detector, which is capable of recording image information with respect to each of pixels when radiation carrying the image information is irradiated to the solid-state radiation detector, and which is capable of outputting the image signal representing the image information having been recorded, and wherein a correction of the image signal is made in accordance with offset information having been previously acquired from the solid-state radiation detector, the method comprising the steps of:

i) previously acquiring high frequency offset component information from the solid-state radiation detector, ii) acquiring low frequency offset component information from the solid-state radiation detector before an operation for recording the image information on the solid-state radiation detector is performed, and iii) correcting the image signal, which has been outputted from the solid-state radiation detector having been subjected to the operation for recording the image information, in accordance with the offset information, which is constituted of the high frequency offset component information and the low frequency offset component information.

The radiation image information detecting method in accordance with the present invention may be modified such that the acquisition of the low frequency offset component information from the solid-state radiation detector is performed with processing, in which offset signal values with respect to each of sets of a plurality of pixels are added together, a sum offset signal value being thereby obtained with respect to each of the sets of the plurality of the pixels, and in which the low frequency offset component information is acquired in accordance with the sum offset signal values having been obtained with respect to the sets of the plurality of the pixels.

In such cases, the radiation image information detecting method in accordance with the present invention may further be modified such that the solid-state radiation detector is capable of outputting a signal by being scanned with line-like reading light irradiated from a line-like light source, and the acquisition of the low frequency offset component information from the solid-state radiation detector is performed with an operation, in which the solid-state radiation detector is scanned with the line-like reading light having a line width larger than the line width of the line-like reading light for the acquisition of the image signal representing the image information having been recorded.

The present invention also provides a radiation image information detecting apparatus, comprising:

i) a solid-state radiation detector, which is capable of recording image information with respect to each of pixels when radiation carrying the image information is irradiated to the solid-state radiation detector, and which is capable of outputting the image signal representing the image information having been recorded, ii) storage means for storing high frequency offset component information, which has been acquired previously, iii) acquisition means for acquiring low frequency offset component information from the solid-state radiation detector before an operation for recording the image information on the solid-state radiation detector is performed, and iv) correction means for correcting the image signal, which has been outputted from the solid-state radiation detector having been subjected to the operation for recording the image information, in accordance with offset information, which is constituted of the high frequency offset component information having been stored in the storage means and the low frequency offset component information having been acquired with the acquisition means.

The radiation image information detecting apparatus in accordance with the present invention may be modified such that the acquisition means performs the acquisition of the low frequency offset component information from the solid-state radiation detector with processing, in which offset signal values with respect to each of sets of a plurality of pixels are added together, a sum offset signal value being thereby obtained with respect to each of the sets of the plurality of the pixels, and in which the low frequency offset component information is acquired in accordance with the sum offset signal values having been obtained with respect to the sets of the plurality of the pixels.

In such cases, the radiation image information detecting apparatus in accordance with the present invention may further be modified such that the solid-state radiation detector is capable of outputting a signal by being scanned with line-like reading light irradiated from a line-like light source, and the acquisition means controls the line-like light source such that the acquisition of the low frequency offset component information from the solid-state radiation detector is performed with an operation, in which the solid-state radiation detector is scanned with the line-like reading light having a line width larger than the line width of the line-like reading light for the acquisition of the image signal representing the image information having been recorded.

The term "solid-state radiation detector" as used herein means the detector, which is capable of detecting the radiation carrying the image information of an object and is capable of outputting the image signal representing the radiation image of the object. The solid-state radiation detector is capable of converting the incident radiation into electric charges directly or after converting the incident radiation into light and is capable of accumulating the electric charges at a charge accumulating section. Thereafter, the solid-state radiation detector is capable of outputting the electric charges to the exterior. With the solid-state radiation detector, the image signal representing the radiation image of the object is thus capable of being acquired.

The solid-state radiation detector may be one of various types of solid-state radiation detectors. For example, from the view point of an electric charge forming process for converting the radiation into the electric charges, the solid-state radiation detectors may be classified into a photo conversion type of solid-state radiation detector and a direct conversion type of solid-state radiation detector. With the photo conversion type of the solid-state radiation detector, the fluorescence, which has been produced by a fluorescent substance when the radiation has been irradiated to the fluorescent substance, is detected by a photoelectric conversion device, and the signal electric charges having thus been generated in the photoelectric conversion device are accumulated at a charge accumulating section of the photoelectric conversion device. Also, the signal electric charges having thus been accumulated at the charge accumulating section are converted into an image signal (an electric signal), and the thus obtained image signal is outputted from the solid-state radiation detector. With the direct conversion type of the solid-state radiation detector, the signal electric charges, which have been generated in a radio-conductive material when the radiation has been irradiated to the radio-conductive material, are collected with a charge collecting electrode and accumulated at a charge accumulating section, the signal electric charges having thus been accumulated at the charge accumulating section are converted into an electric signal, and the thus obtained electric signal is outputted from the solid-state radiation detector. Also, from the view point of an electric charge read-out process for reading out the accumulated electric charges to the exterior, the solid-state radiation detectors maybe classified into an optical read-out type of solid-state radiation detector and a thin-film transistor (TFT) read-out type of solid-state radiation detector. With the optical read-out type of the solid-state radiation detector, reading light (a reading electromagnetic wave) is irradiated to the solid-state radiation detector, and electric charges having been accumulated are thereby read out. With the TFT read-out type of the solid-state radiation detector, TFT's connected to a charge accumulating section are actuated successively, and electric charges having been accumulated are thereby read out. The solid-state radiation detector may also be an improved direct conversion type of solid-state radiation detector, which has been proposed by the applicant in, for example, U.S. Pat. Nos. 6,828,539 and 6,268,614. The improved direct conversion type of the solid-state radiation detector is constituted of a combination of the direct conversion type and the optical read-out type.

With the radiation image information detecting method and apparatus in accordance with the present invention, the image signal is acquired from the solid-state radiation detector, which is capable of recording the image information with respect to each of the pixels when the radiation carrying the image information is irradiated to the solid-state radiation detector, and which is capable of outputting the image signal representing the image information having been recorded, and the correction of the image signal is made in accordance with the offset information having been previously acquired from the solid-state radiation detector. The offset information is classified into the low frequency offset component information, whose offset characteristics are apt to alter with the passage of time and are capable of being acquired comparatively quickly, and the high frequency offset component information, whose offset characteristics are not apt to alter with the passage of time and are not capable of being acquired quickly. The high frequency offset component information is acquired previously from the solid-state radiation detector. Before each of the operations for recording the image information on the solid-state radiation detector is performed, only the low frequency offset component information, which is capable of being acquired comparatively quickly, is acquired from the solid-state radiation detector. The image signal, which has been outputted from the solid-state radiation detector having been subjected to the operation for recording the image information, is corrected in accordance with the offset information, which is constituted of the high frequency offset component information and the low frequency offset component information. Therefore, with the radiation image information detecting method and apparatus in accordance with the present invention, the offset components contained in the image signal are capable of being removed quickly and accurately. Accordingly, it is not necessary for the imaging operator to wait for a long time before the imaging operation becomes possible, and the imaging work flow is capable of being improved.

DESCRIPTION OF THE PREFERRED EMBODIMENTS

The present invention will hereinbelow be described in further detail with reference to the accompanying drawings.

Figure 1:
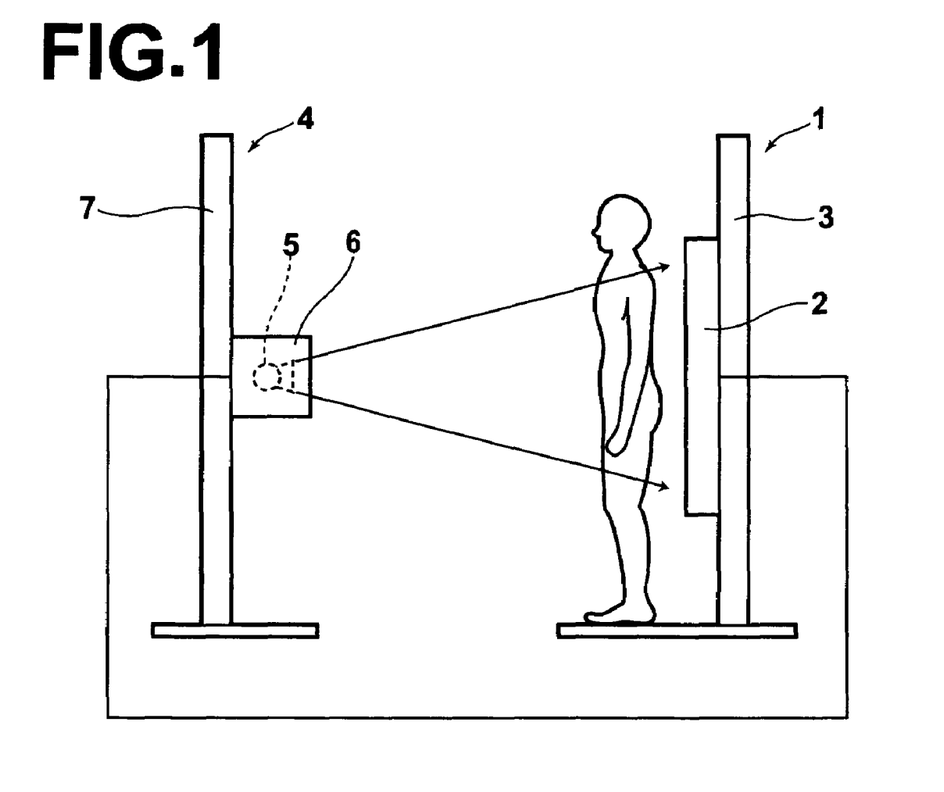
FIG. 1 is a schematic view showing an embodiment of the X-ray (radiation) image information detecting apparatus in accordance with the present invention.
Figure 2A:
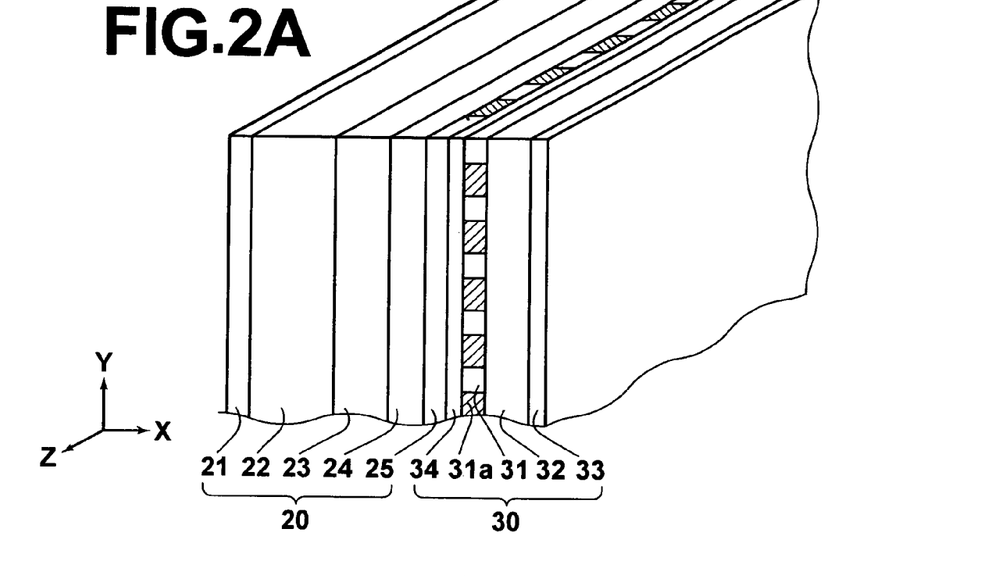
FIG. 2A is a perspective view showing a solid-state radiation detector employed in the X-ray image information detecting apparatus of FIG. 1.
Figure 2B:
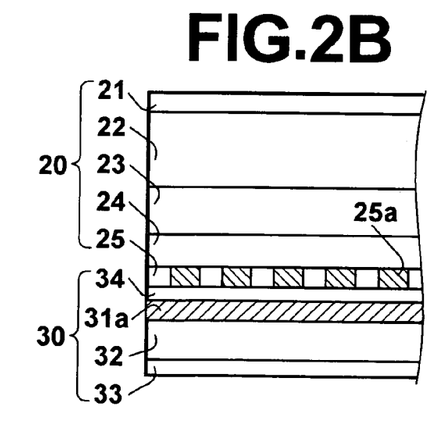
FIG. 2B is an X-Z sectional view showing the solid-state radiation detector of FIG. 2A.
Figure 2C:
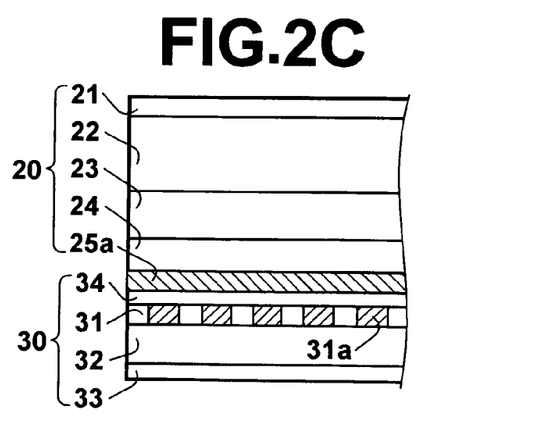
FIG. 2C is an X-Y sectional view showing the solid-state radiation detector of FIG. 2A.
Figure 3:
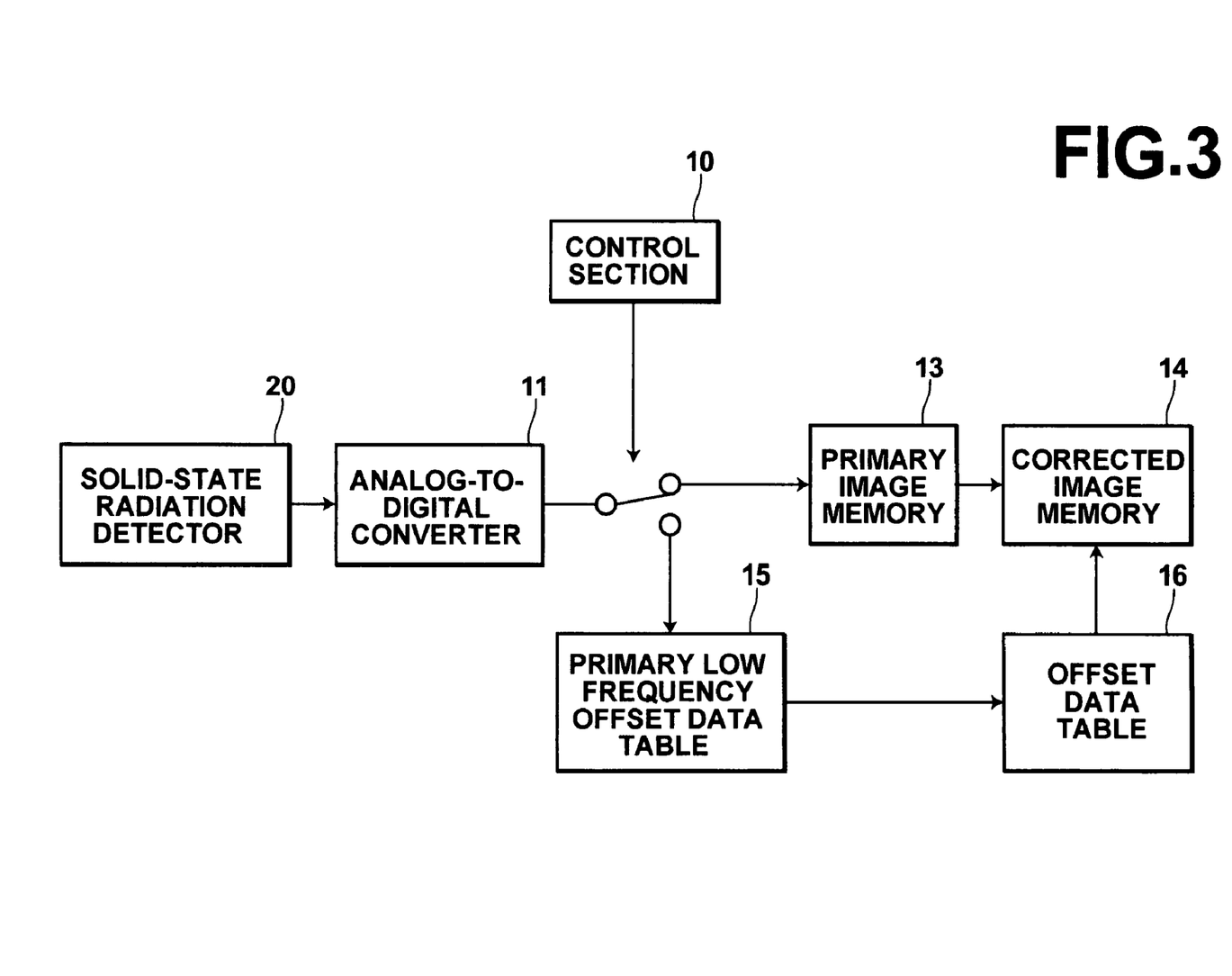
FIG. 3 is a block diagram showing a flow of processing performed by the X-ray image information detecting apparatus of FIG. 1, FIGS. 4A to 4H are timing charts showing timings of processing at the time of an imaging operation performed by the X-ray image information detecting apparatus of FIG. 1, and FIGS. 5A to 5G are timing charts showing timings of processing at the time of an imaging operation performed by a different embodiment of the X-ray image information detecting apparatus in accordance with the present invention.

FIG. 1 is a schematic view showing an embodiment of the X-ray (radiation) image information detecting apparatus in accordance with the present invention. FIG. 2A is a perspective view showing a solid-state radiation detector employed in the X-ray image information detecting apparatus of FIG. 1. FIG. 2B is an X-Z sectional view showing the solid-state radiation detector of FIG. 2A. FIG. 2C is an X-Y sectional view showing the solid-state radiation detector of FIG. 2A. FIG. 3 is a block diagram showing a flow of processing performed by the X-ray image information detecting apparatus of FIG. 1.

As illustrated in FIG. 1, an X-ray image information detecting apparatus 1, which is an embodiment of the X-ray image information detecting apparatus in accordance with the present invention, comprises a main body section 2, in which a solid-state radiation detector 20 (illustrated in FIG. 2A) is accommodated. The X-ray image information detecting apparatus 1 also comprises a base 3 for supporting the main body section 2. Also, an X-ray irradiating apparatus 4 for irradiating X-rays to the X-ray image information detecting apparatus 1 comprises an X-ray source accommodating section 6, in which an X-ray source 5 is accommodated. The X-ray irradiating apparatus 4 also comprises a base 7 for supporting the X-ray source accommodating section 6. The X-ray irradiating apparatus 4 and a control section 10 (illustrated in FIG. 3) of the X-ray image information detecting apparatus 1 are connected with each other by a cable. Information representing the states of operations in the X-ray irradiating apparatus 4 is capable of being sent from the X-ray irradiating apparatus 4 through the cable into the control section 10 of the X-ray image information detecting apparatus 1.

The solid-state radiation detector 20 and a surface-shaped light source 30 (illustrated in FIG. 2A) for scanning the solid-state radiation detector 20 are overlaid on a glass base plate (not shown).

The solid-state radiation detector 20 is capable of recording radiation image information as an electrostatic latent image. The solid-state radiation detector 20 is also capable of generating electric currents in accordance with the electrostatic latent image, which has been recorded on the solid-state radiation detector 20, when the solid-state radiation detector 20 is scanned with a reading electromagnetic wave (hereinbelow referred to as the reading light). The solid-state radiation detector 20 comprises a first electrical conductor layer 21, which has transmissivity with respect to recording radiation (hereinbelow referred to as the recording light), such as the X-rays, carrying the image information of an object. The solid-state radiation detector 20 also comprises a recording photo-conductor layer 22, which is capable of generating electric charges and exhibiting electrical conductivity when the recording light is irradiated to the recording photo-conductor layer 22. The solid-state radiation detector 20 further comprises a charge transporting layer 23, which acts approximately as an electrical insulator with respect to latent image polarity charges (e.g., negative charges) occurring in the first electrical conductor layer 21, and which acts approximately as an electrical conductor with respect to transported polarity charges (in this case, positive charges) having the polarity opposite to the polarity of the latent image polarity charges. The solid-state radiation detector 20 still further comprises a reading photo-conductor layer 24, which is capable of generating electric charges and exhibiting the electrical conductivity when the reading light is irradiated to the reading photo-conductor layer 24. The solid-state radiation detector 20 also comprises a second electrical conductor layer 25, which has the transmissivity with respect to the reading light. The first electrical conductor layer 21, the recording photo-conductor layer 22, the charge transporting layer 23, the reading photo-conductor layer 24, and the second electrical conductor layer 25 are overlaid in this order. A charge accumulating section is formed at an interface between the recording photo-conductor layer 22 and the charge transporting layer 23.

Each of the first electrical conductor layer 21 and the second electrical conductor layer 25 constitutes an electrode. The electrode of the first electrical conductor layer 21 is formed as a flat plate-shaped electrode, which is flat in two-dimensional directions. As indicated by the hatching in FIG. 2A, the electrode of the second electrical conductor layer 25 is formed as a striped electrode, which is constituted of a plurality of elements (i.e., linear electrodes) 25a, 25a, . . . arrayed at pixel pitches in a striped form (as in the cases of an electrostatic recording material described in, for example, U.S. Pat. No. 6,828,539). Each of the elements 25a, 25a, . . . is electrically connected to current detecting means (not shown). The array direction, in which the elements 25a, 25a, . . . are arrayed so as to stand side by side, corresponds to a main scanning direction. The length direction, in which each of the elements 25a, 25a, . . . extends, corresponds to a sub-scanning direction.

The reading photo-conductor layer 24 should preferably be constituted of a photo-conductive substance, which has a high sensitivity with respect to electromagnetic waves having wavelengths (300 nm to 550 nm) falling within an near ultraviolet to blue light wavelength range, and which has a low sensitivity with respect to electromagnetic waves having wavelengths (at least 700 nm) falling within a red light wavelength range. Specifically, the reading photo-conductor layer 24 should preferably be constituted of a photo-conductive material, which contains, as a principal constituent, at least one substance selected from the group consisting of a-Se (i.e., amorphous selenium), $PbI_2$, $Bi_{12}(Ge,Si)O_{20}$, perylene bis-imide (R: n-propyl), and perylene bis-imide (R: n-neopentyl). In this embodiment, a-Se is employed as the material constituting the reading photo-conductor layer 24.

The surface-shaped light source 30 is constituted of an electroluminescent (EL) light emitting device. The surface-shaped light source 30 comprises an electrical conductor layer 31, an EL layer 32, and an electrical conductor layer 33. An electrical insulation layer 34 is located between the second electrical conductor layer 25 of the solid-state radiation detector 20 and the electrical conductor layer 33 of the surface-shaped light source 30. The electrical conductor layer 31 is formed as a striped electrode, which is constituted of a plurality of elements (i.e., linear electrodes) 31a, 31a, . . . arrayed at pixel pitches in a striped form, such that the elements 31a, 31a, . . . intersect (in this embodiment, approximately orthogonally) with the elements 25a, 25a, . . . constituting the second electrical conductor layer 25 of the solid-state radiation detector 20. As a result, a plurality of line-like light sources, each of which is constituted of one of the elements 31a, 31a, . . . (hatched in FIG. 2A), are arrayed in a surface-like form. Each of the elements 31a, 31a, . . . is electrically connected to light source control means (not shown). Also, each of the elements 31a, 31a, . . . is made from a material, which is transparent with respect to EL light emitted by the EL layer 32. The electrical conductor layer 33 is formed as a flat plate-shaped electrode. The electrical conductor layer 33 is made from a material, which is capable of totally reflecting the EL light emitted by the EL layer 32.

As described above, the reading photo-conductor layer 24 should preferably be constituted of the photo-conductive substance, which has a high sensitivity with respect to the electromagnetic waves having wavelengths (300 nm to 550 nm) falling within the near ultraviolet to blue light wavelength range, and which has a low sensitivity with respect to the electromagnetic waves having wavelengths (at least 700 nm) falling within the red light wavelength range. In such cases, the surface-shaped light source 30 may be constituted of an EL light emitting device, which is capable of producing the light having wavelengths (at most 550 nm) falling within the near ultraviolet to blue light wavelength range.

The light source control means (not shown) applies a predetermined voltage between the electrical conductor layer 31 and the electrical conductor layer 33. Specifically, the light source control means successively applies the predetermined voltage between each of the elements 31a, 31a, . . . of the electrical conductor layer 31 and the electrical conductor layer 33. Alternatively, the light source control means may apply the predetermined voltage between a group of several elements, which are among the elements 31a, 31a, . . . of the electrical conductor layer 31, and the electrical conductor layer 33, simultaneously. As another alternative, the light source control means may apply the predetermined voltage between all of the elements 31a, 31a, . . . of the electrical conductor layer 31 and the electrical conductor layer 33 simultaneously. In cases where the light source control means is to apply the predetermined voltage between each of the elements 31a, 31a, . . . of the electrical conductor layer 31 and the electrical conductor layer 33, the light source control means successively changes over the elements 31a, 31a, . . . of the electrical conductor layer 31 and applies the predetermined d.c. voltage between each of the elements 31a, 31a, . . . and the electrical conductor layer 33. With the application of the d.c. voltage, the EL light is emitted from the region of the EL layer 32, which region is sandwiched between each of the elements 31a, 31a, . . . and the electrical conductor layer 33. Each of the elements 31a, 31a, . . . is the line-like element. Therefore, the EL light having passed through each of the elements 31a, 31a, . . . is capable of being utilized as the line-like reading light. Specifically, the surface-shaped light source 30 is equivalent to a light source, which is constituted of a plurality of line-like small light sources arrayed in a surface-shaped form. In cases where the elements 31a, 31a, . . . are thus successively changed over for causing the EL light to be emitted from the surface-shaped light source 30, the solid-state radiation detector 20 is capable of being scanned with the reading light by use of the electrical operation.

An operation pattern (i.e., a light source operation mode), in which the surface-shaped light source 30 is operated by the light source control means, includes four modes, i.e. a light emission inhibiting mode (M0), a low frequency offset component detecting mode (M1), an image detecting mode (M2), and a residual image erasing mode (M3).

In the light emission inhibiting mode (M0), the voltage is not applied between each of the elements 31a, 31a, . . . and the electrical conductor layer 33, and the light emission from the surface-shaped light source 30 is inhibited.

In the low frequency offset component detecting mode (M1), the predetermined voltage is applied between a group of several elements, which are among the elements 31a, 31a, . . . of the electrical conductor layer 31, and the electrical conductor layer 33, simultaneously. Specifically, the voltage application is performed successively with respect to a plurality of the groups of the several elements, which are among the elements 31a, 31a, . . . of the electrical conductor layer 31. The scanning of the solid-state radiation detector 20 is thus performed with line-like reading light, which has a line width larger than the line width of the line-like reading light employed in the image detecting mode (M2).

In the image detecting mode (M2), the predetermined voltage is successively applied between each of the elements 31a, 31a, . . . of the electrical conductor layer 31 and the electrical conductor layer 33. The scanning of the solid-state radiation detector 20 is thus performed with the line-like reading light emitted by the region of the EL layer 32, which region is sandwiched between each of the elements 31a, 31a, . . . and the electrical conductor layer 33.

In the residual image erasing mode (M3), the predetermined voltage is applied between all of the elements 31a, 31a, . . . of the electrical conductor layer 31 and the electrical conductor layer 33 simultaneously. The light is thus emitted from the entire area of the surface-shaped light source 30. Alternatively, the predetermined voltage may be applied between a group of several elements, which are among the elements 31a, 31a, . . . of the electrical conductor layer 31, and the electrical conductor layer 33, simultaneously, and the light may thus be emitted from each of a plurality of areas of the surface-shaped light source 30, which areas correspond to the groups of the several elements among the elements 31a, 31a, . . .

How the X-ray image information detecting apparatus 1 operates will be described hereinbelow. All of the operations of the X-ray image information detecting apparatus 1 are controlled by the control section 10.

Specifically, the X-ray image information detecting apparatus 1 is actuated. Before a first imaging operation is performed, the surface-shaped light source 30 is actuated in the image detecting mode (M2), and an offset signal is detected from the solid-state radiation detector 20. The offset signal values, each of which has been obtained from one of the elements 25a, 25a, . . . of the solid-state radiation detector 20, are detected by the current detecting means (not shown). The signal having been detected by the current detecting means is converted into a digital offset signal by an analog-to-digital converter 11. Also, the high frequency offset component and the low frequency offset component are separated from the offset signal having been obtained from the analog-to-digital conversion, and the high frequency offset component information is thereby acquired. The high frequency offset component information having thus been acquired is stored in an offset data table 16. In order for the high frequency offset component and the low frequency offset component to be separated from the offset signal having been obtained from the analog-to-digital conversion, the offset signal may be passed through a low pass filter having a binning masking size, which will be described later.

At the point of time at which the high frequency offset component information has been stored in the offset data table 16, the X-ray image information detecting apparatus 1 is set in an imaging operation waiting state, in which the X-ray image information detecting apparatus 1 is capable of accepting an imaging request made by an imaging operator.

FIGS. 4A to 4H are timing charts showing the timings of processing performed after the imaging operation waiting state.

Figure 4A:
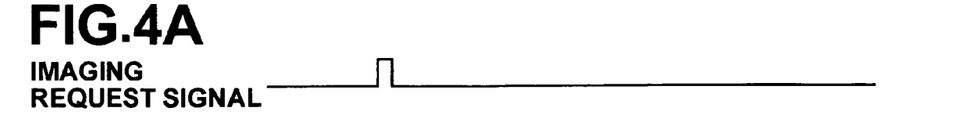
Figure 4B:
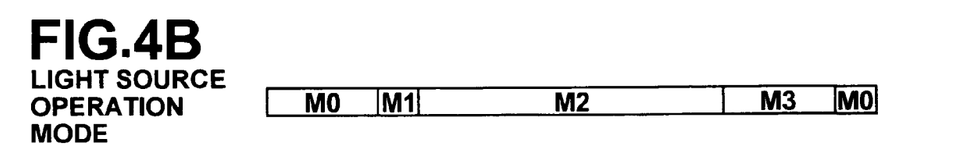
Figure 4C:
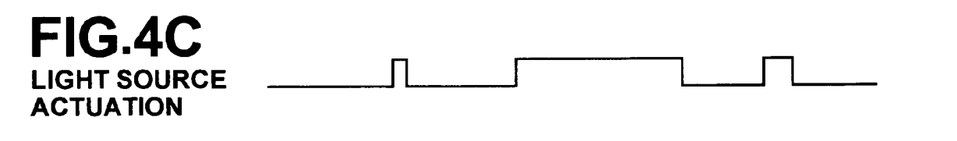
Figure 4D:
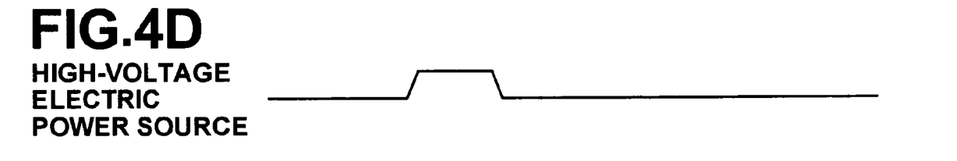
Figure 4E:
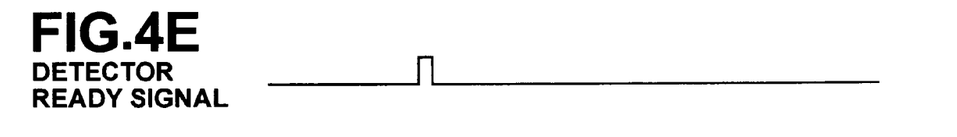
Figure 4F:
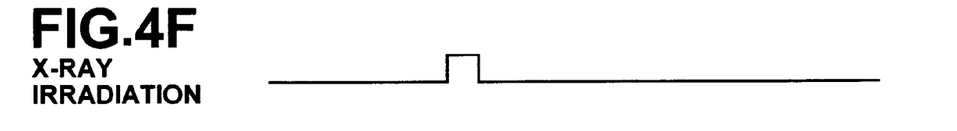
Figure 4G:
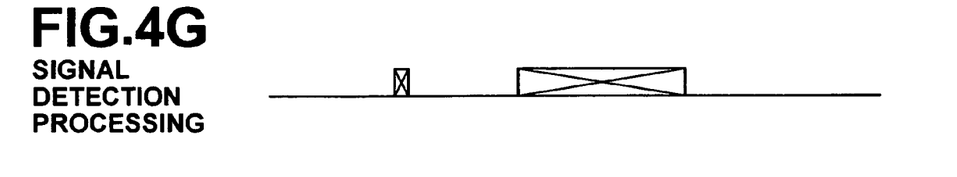
Figure 4H:
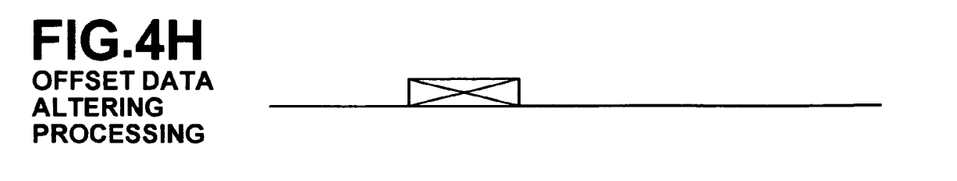
Figure 5A:
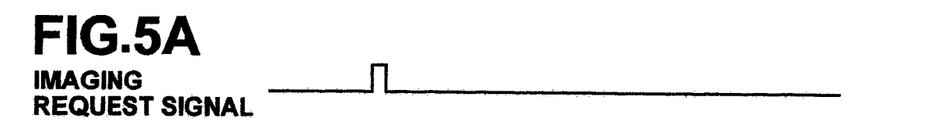
Figure 5B:
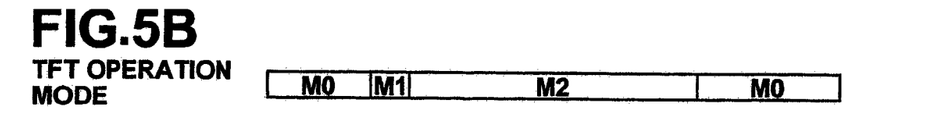
Figure 5C:
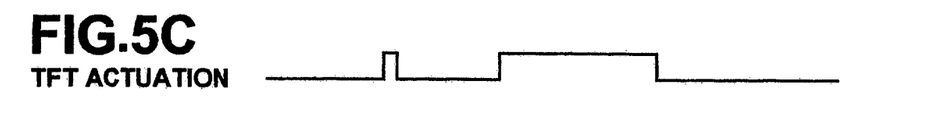
Figure 5D:
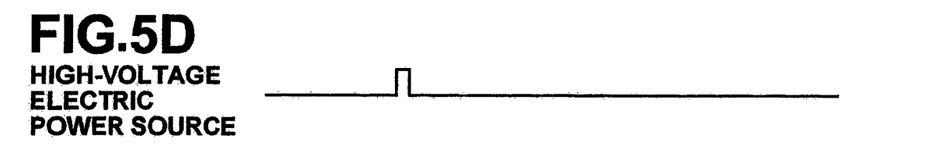
Figure 5E:
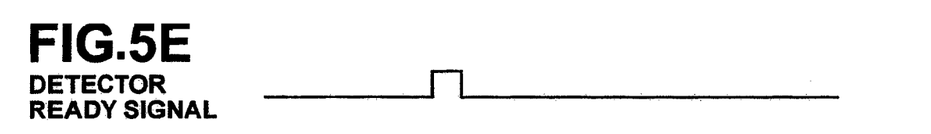
Figure 5F:
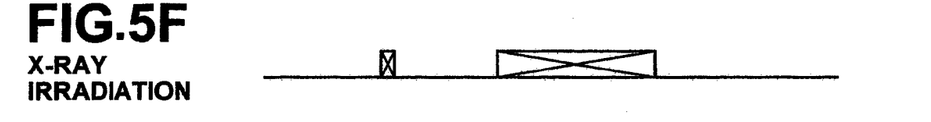
Figure 5G:
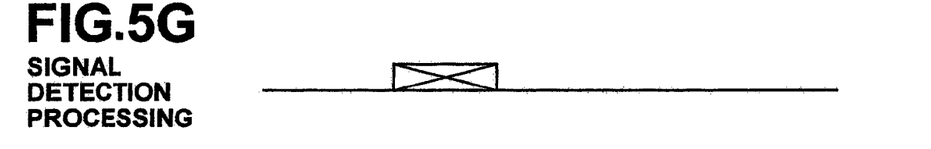

Imaging buttons (not shown) of the X-ray irradiating apparatus 4 are formed as two-stage types of push buttons. In cases where the first-stage imaging button is pushed by the imaging operator, an imaging request signal is sent from the X-ray irradiating apparatus 4 into the control section 10 of the X-ray image information detecting apparatus 1.

When the X-ray image information detecting apparatus 1 receives the imaging request signal, the X-ray image information detecting apparatus 1 actuates the surface-shaped light source 30 in the low frequency offset component detecting mode (M1) and detects the offset signal from the solid-state radiation detector 20. In the low frequency offset component detecting mode (M1), the scanning is performed in units of several elements among the elements 31a, 31a, . . . . Therefore, the offset signal values with respect to "n" number of pixels arrayed in the longitudinal direction of each of the elements 25a, 25a, . . . , which pixel number corresponds to the scanning width of the surface-shaped light source 30, are added together. A sum offset signal value of the offset signal values with respect to the "n" number of pixels is detected. Also, the output signal values with respect to the same number of the elements 25a, 25a, . . . , which are adjacent to one another, as the pixel number "n" corresponding to the scanning width of the surface-shaped light source 30 may be simultaneously added together. In such cases, binning of n×n pixels is capable of being performed. The low frequency offset component information having been obtained in the manner described above is stored in a primary low frequency offset data table 15. In cases where the entire area of the solid-state radiation detector 20 is scanned with the processing described above, the low frequency offset component information is capable of being acquired more quickly than the cases where the elements 31a, 31a, . . . of the surface-shaped light source 30 are changed over with respect to each line during the scanning.

At the point of time at which the acquisition of the low frequency offset component information has been completed, the X-ray image information detecting apparatus 1 starts the voltage application to the solid-state radiation detector 20. Also, at the point of time at which the predetermined voltage has been applied to the solid-state radiation detector 20, the X-ray image information detecting apparatus 1 sends a "ready" signal, which represents that the solid-state radiation detector 20 has been set in the imaging operation possible state, into the side of the X-ray irradiating apparatus 4. When the X-ray irradiating apparatus 4 receives the "ready" signal, the X-ray irradiating apparatus 4 gives the imaging operator notice on a console (not shown) that the preparation for the imaging operation on the side of the X-ray image information detecting apparatus 1 has been completed. The X-ray image information detecting apparatus 1 is thus set in an X-ray irradiation waiting state.

In the X-ray irradiation waiting state, the second-stage imaging button of the X-ray irradiating apparatus 4 is pushed by the imaging operator. As a result, the X-rays are irradiated from the X-ray source 5 toward the X-ray image information detecting apparatus 1, and the X-ray image recording operation with the X-ray image information detecting apparatus 1 is performed.

The series of the operations between when the first-stage imaging button of the X-ray irradiating apparatus 4 has been pushed by the imaging operator and when the X-ray irradiating apparatus 4 is set in the X-ray irradiation waiting state are performed quickly. Therefore, the imaging operator need not wait for a long period of time before the imaging operation becomes possible.

Also, after the low frequency offset component information has been acquired, smoothing processing is performed on the low frequency offset component information having been stored in the primary low frequency offset data table 15, and the low frequency offset component information, which has been obtained from the smoothing processing, is stored in the offset data table 16. The smoothing processing and the processing for storing the low frequency offset component information, which has been obtained from the smoothing processing, in the offset data table 16 are performed in parallel with the image recording processing described above.

When the image recording operation described above has been completed, the X-ray image information detecting apparatus 1 actuates the surface-shaped light source 30 in the image detecting mode (M2) and detects the image signal from the solid-state radiation detector 20. The detected image signal is stored in a primary image memory 13. Also, the X-ray image information detecting apparatus 1 corrects the image signal, which has been stored in the primary image memory 13, in accordance with the offset information (constituted of the high frequency offset component information and the low frequency offset component information) having been stored in the offset data table 16. The corrected image signal having thus been obtained is stored in a corrected image memory 14.

Thereafter, the X-ray image information detecting apparatus 1 actuates the surface-shaped light source 30 in the residual image erasing mode (M3) and erases the residual image remaining in the solid-state radiation detector 20. At this stage, the series of the processing is completed. In cases where the next imaging operation is to be performed, the processing from the imaging operation waiting state as illustrated in FIGS. 4A to 4H is iterated.

In the embodiment described above, the optical read-out type of the solid-state radiation detector as described in, for example, U.S. Pat. No. 6,828,539 is employed as the solid-state radiation detector 20. Alternatively, a TFT read-out type of a solid-state radiation detector may be employed. In such cases, the same effects as those described above are capable of being obtained. FIG. 5A to 5G show the timings of processing performed after the imaging operation waiting state in a different embodiment of the radiation image information detecting apparatus in accordance with the present invention, in which the TFT read-out type of the solid-state radiation detector is employed.

In cases where the TFT read-out type of the solid-state radiation detector is employed, the timing of the processing is basically identical with the timing of the processing performed in cases where the optical read-out type of the solid-state radiation detector 20 is employed. However, in cases where the TFT read-out type of the solid-state radiation detector is employed, the operation for erasing the residual image after the image signal has been detected becomes unnecessary. Therefore, at the time at which the correction processing in accordance with the offset information has been performed on the image signal having been detected from the solid-state radiation detector, the series of the processing is finished.

What is claimed is:

1. A radiation image information detecting method, wherein an image signal is acquired from a solid-state radiation detector, which is capable of recording image information with respect to each of pixels when radiation carrying the image information is irradiated to the solid-state radiation detector, and which is capable of outputting the image signal representing the image information having been recorded, and wherein a correction of the image signal is made in accordance with offset information having been previously acquired from the solid-state radiation detector, the method comprising:

previously acquiring high frequency offset component information from the solid-state radiation detector;

acquiring low frequency offset component information from the solid-state radiation detector before an operation for recording the image information on the solid-state radiation detector is performed; and correcting the image signal, which has been outputted from the solid-state radiation detector having been subjected to the operation for recording the image information, in accordance with the offset information, which is constituted of the high frequency offset component information and the low frequency offset component information, wherein the acquiring of high frequency offset component information from the solid-state radiation detector comprises: acquiring an image offset signal from a solid-state radiation detector; converting the image offset signal to a digital offset signal; applying a filter to the image offset signal to separate the high frequency offset component information of the image offset signal and the low frequency component information of the image offset signal; and storing the high frequency offset component information.

2. A method as defined in claim 1 wherein the acquisition of the low frequency offset component information from the solid-state radiation detector is performed with processing, in which offset signal values with respect to each of sets of a plurality of pixels are added together, a sum offset signal value being thereby obtained with respect to each of the sets of the plurality of the pixels, and in which the low frequency offset component information is acquired in accordance with the sum offset signal values having been obtained with respect to the sets of the plurality of the pixels.

3. A method as defined in claim 2 wherein the solid-state radiation detector is capable of outputting a signal by being scanned with line-like reading light irradiated from a line-like light source, and the acquisition of the low frequency offset component information from the solid-state radiation detector is performed with an operation, in which the solid-state radiation detector is scanned with the line-like reading light having a line width larger than the line width of the line-like reading light for the acquisition of the image signal representing the image information having been recorded.

4. A radiation image information detecting apparatus, comprising:

a solid-state radiation detector, which is capable of recording image information with respect to each of pixels when radiation carrying the image information is irradiated to the solid-state radiation detector, and which is capable of outputting the image signal representing the image information having been recorded;

storage means for storing high frequency offset component information, which has been acquired previously;

acquisition means for acquiring low frequency offset component information from the solid-state radiation detector before an operation for recording the image information on the solid-state radiation detector is performed;

correction means for correcting the image signal, which has been outputted from the solid-state radiation detector having been subjected to the operation for recording the image information, in accordance with offset information, which is constituted of the high frequency offset component information having been stored in the storage means and the low frequency offset component information having been acquired with the acquisition means; and a filter for separating the high frequency offset component information and the low frequency offset information of image information irradiated to the solid state radiation detector.

5. An apparatus as defined in claim 4 wherein the acquisition means performs the acquisition of the low frequency offset component information from the solid-state radiation detector with processing, in which offset signal values with respect to each of sets of a plurality of pixels are added together, a sum offset signal value being thereby obtained with respect to each of the sets of the plurality of the pixels, and in which the low frequency offset component information is acquired in accordance with the sum offset signal values having been obtained with respect to the sets of the plurality of the pixels.

6. An apparatus as defined in claim 5 wherein the solid-state radiation detector is capable of outputting a signal by being scanned with line-like reading light irradiated from a line-like light source, and the acquisition means controls the line-like light source such that the acquisition of the low frequency offset component information from the solid-state radiation detector is performed with an operation, in which the solid-state radiation detector is scanned with the line-like reading light having a line width larger than the line width of the line-like reading light for the acquisition of the image signal representing the image information having been recorded.

* * * * *